(12) United States Patent
Wilmoth et al.

(10) Patent No.: US 10,360,959 B2
(45) Date of Patent: *Jul. 23, 2019

(54) ADJUSTING INSTRUCTION DELAYS TO THE LATCH PATH IN DDR5 DRAM

(71) Applicant: MICRON TECHNOLOGY, INC., Boise, ID (US)

(72) Inventors: David D. Wilmoth, Allen, TX (US); Jason M. Brown, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/137,428

(22) Filed: Sep. 20, 2018

(65) Prior Publication Data

US 2019/0066745 A1    Feb. 28, 2019

Related U.S. Application Data

(63) Continuation of application No. 15/691,394, filed on Aug. 30, 2017, now Pat. No. 10,176,858.

(51) Int. Cl.
| | | |
|---|---|---|
| *G11C 8/00* | (2006.01) | |
| *G11C 8/18* | (2006.01) | |
| *G11C 11/4063* | (2006.01) | |
| *G11C 7/10* | (2006.01) | |
| *G11C 11/408* | (2006.01) | |

(Continued)

(52) U.S. Cl.
CPC ............... *G11C 8/18* (2013.01); *G11C 7/109* (2013.01); *G11C 7/1087* (2013.01); *G11C 7/1093* (2013.01); *G11C 11/4063* (2013.01); *G11C 11/4082* (2013.01); *G11C 11/4093* (2013.01); *G11C 29/023* (2013.01); *G11C 29/28* (2013.01); *G11C 8/10* (2013.01); *G11C 2207/2254* (2013.01)

(58) Field of Classification Search
CPC .................................. G11C 8/06; G11C 8/18
USPC ...................................................... 365/230.08
See application file for complete search history.

(56) References Cited

U.S. PATENT DOCUMENTS 5,930,177 A    7/1999  Kim
6,256,260 B1   6/2001  Shim et al.
(Continued)

OTHER PUBLICATIONS

PCT International Search Report & Written Opinion for PCT Application No. PCT/US2018/027819 dated Oct. 11, 2018; 12 Pages.

*Primary Examiner* — Huan Hoang
(74) *Attorney, Agent, or Firm* — Fletcher Yoder, P.C.

(57) ABSTRACT

Memory devices may provide a communication interface that is configured to receive control signals, and/or address signals from user circuitry, such as a processor. The memory device may receive and process signals employing different signal paths that may have different latencies, leading to clock skews. Embodiments discussed herein the application are related to interface circuitry that may decrease certain response times of the memory device by adding delays that minimize the clock skews. For example, a delay in a control path, such as a chip select path, may allow reduction in a delay of an address path, and leading to a decrease of the access time of the memory device. Embodiments also disclose how training modes may be employed to further adjust the delays in the control and/or address paths to decrease access times during regular operation.

15 Claims, 3 Drawing Sheets

(51) Int. Cl.
*G11C 11/4093* (2006.01)
*G11C 29/02* (2006.01)
*G11C 29/28* (2006.01)
*G11C 8/10* (2006.01)

(56) References Cited

U.S. PATENT DOCUMENTS

| | | | |
|---|---|---|---|
| 6,269,451 B1* | 7/2001 | Mullarkey | G06F 5/06 |
| | | | 713/401 |
| 6,714,463 B2* | 3/2004 | Han | G11C 7/22 |
| | | | 365/185.17 |
| 7,274,237 B2* | 9/2007 | Zimlich | G11C 7/22 |
| | | | 327/261 |
| 9,455,019 B2 | 9/2016 | Kondo | |
| 9,472,250 B1* | 10/2016 | Oh | G11C 7/22 |
| 9,520,169 B2* | 12/2016 | Matsui | G11C 11/4076 |
| 2006/0176744 A1 | 8/2006 | Stave | |
| 2014/0189224 A1 | 7/2014 | Kostinsky et al. | |
| 2014/0368241 A1 | 12/2014 | Ko | |
| 2017/0110173 A1 | 4/2017 | Matsuno et al. | |

\* cited by examiner

ADJUSTING INSTRUCTION DELAYS TO THE LATCH PATH IN DDR5 DRAM

CROSS-REFERENCE TO RELATED APPLICATION

This application is a Continuation of and claims priority to U.S. patent application Ser. No. 15/691,394, filed on Aug. 30, 2017, which is herein incorporated by reference.

BACKGROUND

Field of the Disclosure

The present disclosure relates to circuitry for memory devices, and more specifically, to circuitry to adjust delays in input processing for received instructions that may be used in a memory device.

Description of Related Art

Random access memory (RAM) devices, such as the ones that may be employed in electrical devices to provide data processing and/or storage, may provide direct availability to addressable data stored in memory circuitry of the device. Certain RAM devices, such as dynamic RAM (DRAM) devices may, for example, have multiple memory banks having many addressable memory elements. RAM devices may also have a command interface that may receive addresses and instructions (e.g., read, write, etc.) for operations that may be associated with those addresses and decoding circuitry that may process the instructions and the addresses to access the corresponding memory banks.

The instructions and addresses to a RAM device may be provided by processing circuitry of an electrical device external to the RAM device. The electrical device may also provide clocking signals that may be synchronous with the instructions and addresses. For example, an edge of a clocking signal may occur in a moment in which an address signal is stable and, thus, should be read by the RAM device. Accordingly, the RAM device may include circuitry that monitors received clocking signals, and reads the address and/or instructions when the clocking signals are received. Due to unknown latencies, such circuitry may include delays to the processing of the received instructions and addresses. Such delays may increase the overall latency of the RAM device and increase power consumption during operation of the RAM device.

BRIEF DESCRIPTION OF THE DRAWINGS

Various aspects of this disclosure may better be understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Many electrical devices may include random access memory (RAM) devices that are coupled to processing circuitry, and may provide storage of data for processing. Examples of RAM devices include dynamic RAM (DRAM) devices and synchronous DRAM (SDRAM) devices, which may store individual bits electronically. The stored bits may be organized into addressable memory elements (e.g., words), which may be directly accessed by the processing circuitry. Memory devices may also include command circuitry to receive instructions and/or addresses from the processing circuitry. For example, in double data rate type five (DDR5) SDRAM devices, instructions and addresses may be provided by using a 14 bit command/address (CA) signal. Processing circuitry may also provide clocking signals to the memory device along with instructions and/or addresses. In DDR5 SDRAM devices, such a clocking signal Clk may be provided by a differential signal pair Clk_t and Clk_c. The clocking signal may provide information to the memory device about when an instruction and/or an address signal is ready to be processed. For example, processing circuitry may provide a clocking signal and instructions to a DDR5 SDRAM device such that the CA signal may be available (e.g., stable, ready) for processing during a transition (e.g., edge) of the Clk signal. A DDR5 SDRAM device, as well as other memory devices configured to share instruction buses, may also receive a chip select (CS) signal, which may inform the memory device that it is the intended destination of the CA signal available on the instruction bus. Moreover, in some standards, such as in the DDR5 standard, commands may be provided using a two-cycle (e.g., two-step) CA signal. In such cases, the CS signal may be used to indicate to the memory device that the current CA signal, the first part or the second instruction in a two-cycle CA signal.

The delay between the data request with CS or CA signals, and the reception of data in a memory device, may be referred to as access time (tAA). Generally, the tAA may depend on the processing times of the received CS and/or CA signals. Processing of CS and CA signals may be performed in accordance with a received clocking signal Clk, and may be susceptible to lags and delays in the input circuitry of the memory devices and delays that may compensate for any unknown latencies. Embodiments described herein discuss memory devices that may have adjustable delays, which may be used to reduce an overall latency in the initial processing of CS and/or CA signals. For example, input circuitry in the memory device may have latches that store the received CA and CS signals as clocked by the Clk signal. Input delays in the Clk, CA, and CS signals may be added and/or adjusted to decrease the tAA by, for example, increasing CS delays and decreasing CA delays. The delays may be adjusted during and/or following a training process, during which a memory device may determine latencies and may adjust skew between CS, CA, and Clk signals. This adjustment of delays may lead to reduced tAA, leading to a decrease in power consumption and/or other resources of the memory device.

As an example, consider a memory device in which a CA signal may be latched based on a received CS signal, which itself may be latched. Delays in the processing of the CS signal to instruct latching of the CA signal may lead to a skew (e.g., time difference) between the latching of the CA signal and a latching of the CS signal. As detailed below, an increase in the delay of the latching of the CS signal may be accompanied by a decrease in the delay of the latching of the CA signal, which may reduce the skew and the tAA (e.g., an access time between receiving the CA signals and providing the requested data). Moreover, as further detailed below, a training mode during the coupling between a user circuitry (e.g., a processor) may cause an anticipation of the CS signal, further reducing the tAA. Note that, while the description of the embodiments relate to DDR5 SDRAM devices and chip select and command and address signals, these systems may be adapted to input stages of other synchronous digital circuitry that may benefit from a reduced latency in the input by means of addition of specific delays and/or presence of training processes.

Figure 1:
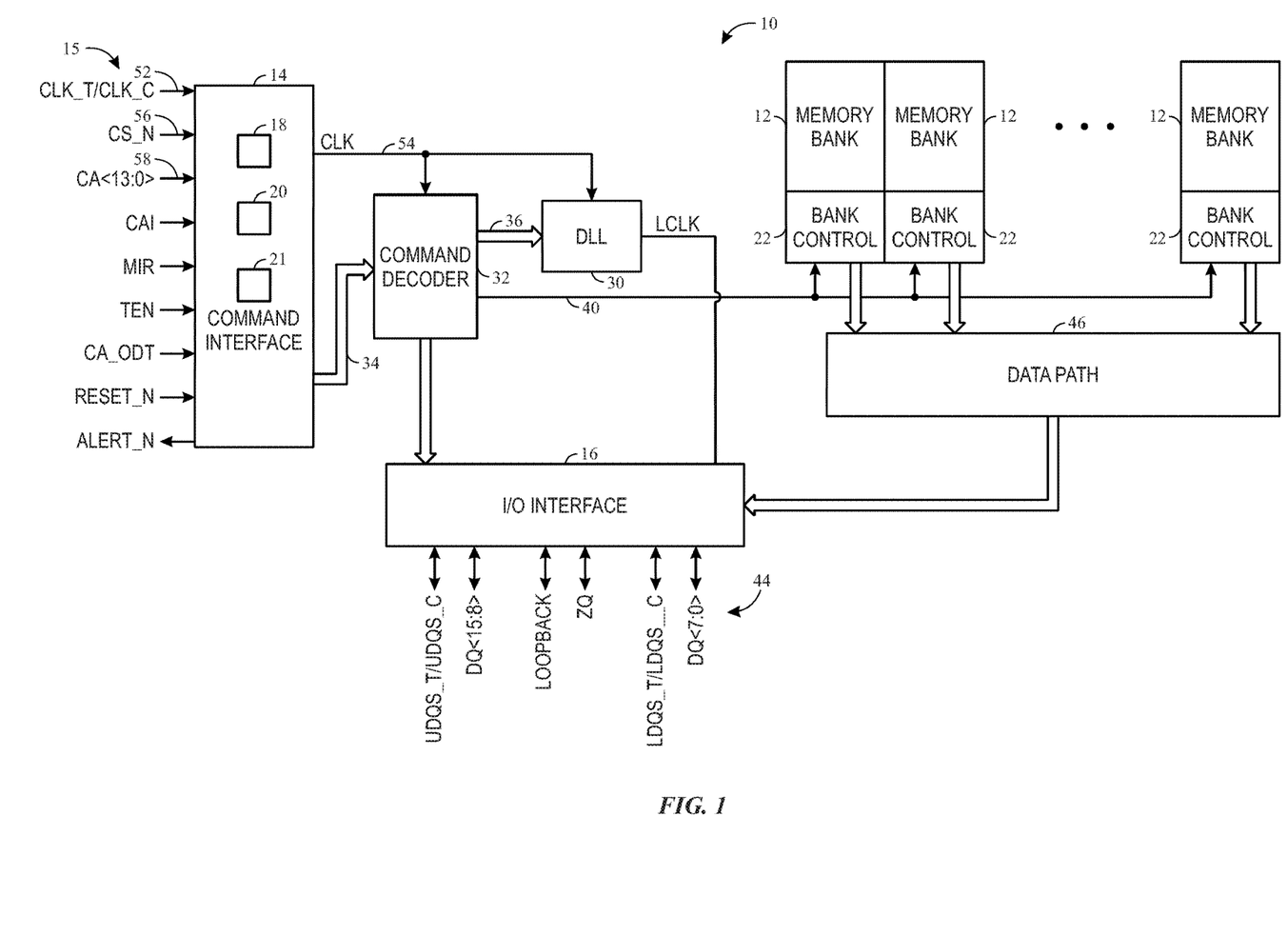
FIG. 1 is a block diagram illustrating an organization of a memory device that may benefit from a faster access time (tAA), in accordance with an embodiment.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM allow for reduced power consumption, more bandwidth and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., ×8 or ×16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabyte (GB) DDR5 SDRAM, the memory chip may include 16 memory banks 12, arranged into 8 bank groups, each bank group including 2 memory banks. For a 16 GB DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16. The command interface 14 is configured to provide a number of signals (e.g., signals 15) from processing circuitry coupled to the devices, such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18, command address input circuit 20, and chip select input circuit 21, for instance, to ensure proper handling of the signals 15. Input circuits 18, 20, and 21 may, for example, perform synchronous latching to provide stable signals 15 for further processing by the memory device 10. The command interface 14 may receive one or more clock signals from an external device. Generally, double data rate (DDR) memory utilizes a clock signal referred to herein as Clk signal 52, which may be provided as a differential pair formed by true clock signal (Clk_t) and the complementary clock signal (Clk_c). The positive clock edge for Clk signal 52 in DDR refers to the point where the rising true clock signal Clk_t crosses the falling complementary clock signal Clk_c, while the negative clock edge indicates that transition of the falling true clock signal Clk_t and the rising of the complementary clock signal Clk_c. Commands (e.g., read command, write command, etc.) are typically entered on the positive edges of the clock signal and data is transmitted or received on both the positive and negative clock edges.

The clock input circuit 18 receives the true clock signal (Clk_t) and the complementary clock signal (Clk_c) and generates an internal clock signal CLK 54. The internal clock signal CLK 54 may be supplied to an internal clock generator, such as a delay locked loop (DLL) circuit 30. The DLL circuit 30 generates a phase controlled internal clock signal LCLK based on the received internal clock signal CLK 54 and the command signals from the command decoder 32 received by the DLL circuit 30 over the bus 36. The phase controlled internal clock signal LCLK is supplied to the I/O interface 16, for instance, and is used as a timing signal for determining an output timing of read data. The internal clock signal CLK 54 may also be provided to various other components within the memory device 10 and may be used to generate various additional internal clock signals. For instance, the internal clock signal CLK 54 may be provided to a command decoder 32. The command decoder 32 may receive command signals from the command bus 34 and may decode the command signals to provide various internal commands. The received command signals may be provided to the command bus 34 from latched inputs in input circuits 18, 20, and 21.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address (CA) bus may be a 14-bit bus to accommodate the command/address signals 58 (CA<13:0>). The command/address signals are clocked to the command interface 14 using the clock 52 (Clk_t and Clk_c), as discussed above. The command interface 14 may include a command address input circuit 20 which is configured to receive and transmit the commands to provide access to the memory banks 12, through the command decoder 32, for instance. In addition, the command interface 14 may receive a chip select (CS) signal. The CS signal 56 enables the memory device 10 to process commands on the incoming CA<13:0> bus. Access to specific banks 12 within the memory device 10 is encoded on the CA<13:0> bus with the commands. As an example, a processor requesting data from memory device 10 may provide a CS enable signal 56 via an input pin to inform the memory device 10 that it should operate on the CA signal 58 available in the bus. To this end, the command interface 14 may gate the CA signal 58 based on the received chip select signal 56 and provide the gated CA signal to the memory banks 12 via the bus 40. Based on the CA signal 58, the memory banks 12 may provide the requested data via data path 46 and I/O interface 16. The tAA may be measured as the time between receiving the CA signal 58 and providing the requested data. For example, an access time tAA may be in a range between about 14 and about 18 ns. As detailed below, delay circuitry may be placed in a CS input circuit 21 to reduce tAA by increasing a delay in the CS signal processing path. The CS input circuit 21 in command interface 14 may further perform a CS training routine to determine and/or cause an advancement of the CS signal in view of the latency in of the CS signal 56 with respect to the Clk signal 52. As briefly discussed above, and detailed below, the CS training routine may be used to further decrease the tAA in the memory device 10.

In addition, the command interface 14 may be configured to receive a number of other command signals. For instance, a command/address on die termination (CA_ODT) signal may be provided to facilitate proper impedance matching within the memory device 10. A reset command (RESET) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT) to the system processor or controller for certain errors that may be detected. For instance, an alert signal (ALERT) may be transmitted from the memory device 10 if a cyclic redundancy check (CRC) error is detected. Other alert signals may also be generated. Further, the bus and pin for transmitting the alert signal (ALERT) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the I/O interface 16. More specifically, the data may be sent to or retrieved from the memory banks 12 over the data path 46, which includes a plurality of bi-directional data buses. Data I/O signals, generally referred to as DQ signals, are generally transmitted and received in one or more bi-directional data busses. For certain memory devices, such as a DDR5 SDRAM memory device, the I/O signals may be divided into upper and lower bytes. For instance, for a x16 memory device, the I/O signals may be divided into upper and lower I/O signals (e.g., DQ<15:8> and DQ<7:0>) corresponding to upper and lower bytes of the data signals, for instance.

To allow for higher data rates within the memory device 10, certain memory devices, such as DDR memory devices, may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t and Clk_c), the data strobe (DQS) signals may be provided as a differential pair of data strobe signals (DQS_t/and DQS_c) to provide differential pair signaling during reads and writes. For certain memory devices, such as a DDR5 SDRAM memory device, the differential pairs of DQS signals may be divided into upper and lower data strobe signals (e.g., UDQS_t/and UDQS_c; LDQS_t/and LDQS_c) corresponding to upper and lower bytes of data sent to and from the memory device 10, for instance.

An impedance (ZQ) calibration signal may also be provided to the memory device 10 through the I/O interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the I/O pins.

In addition, a loopback signal (LOOPBACK) may be provided to the memory device 10 through the I/O interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the I/O interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory system 10. Accordingly, it should be understood that the block diagram of FIG. 1 is only provided to highlight certain functional features of the memory device 10 to aid in the subsequent detailed description.

Figure 2:
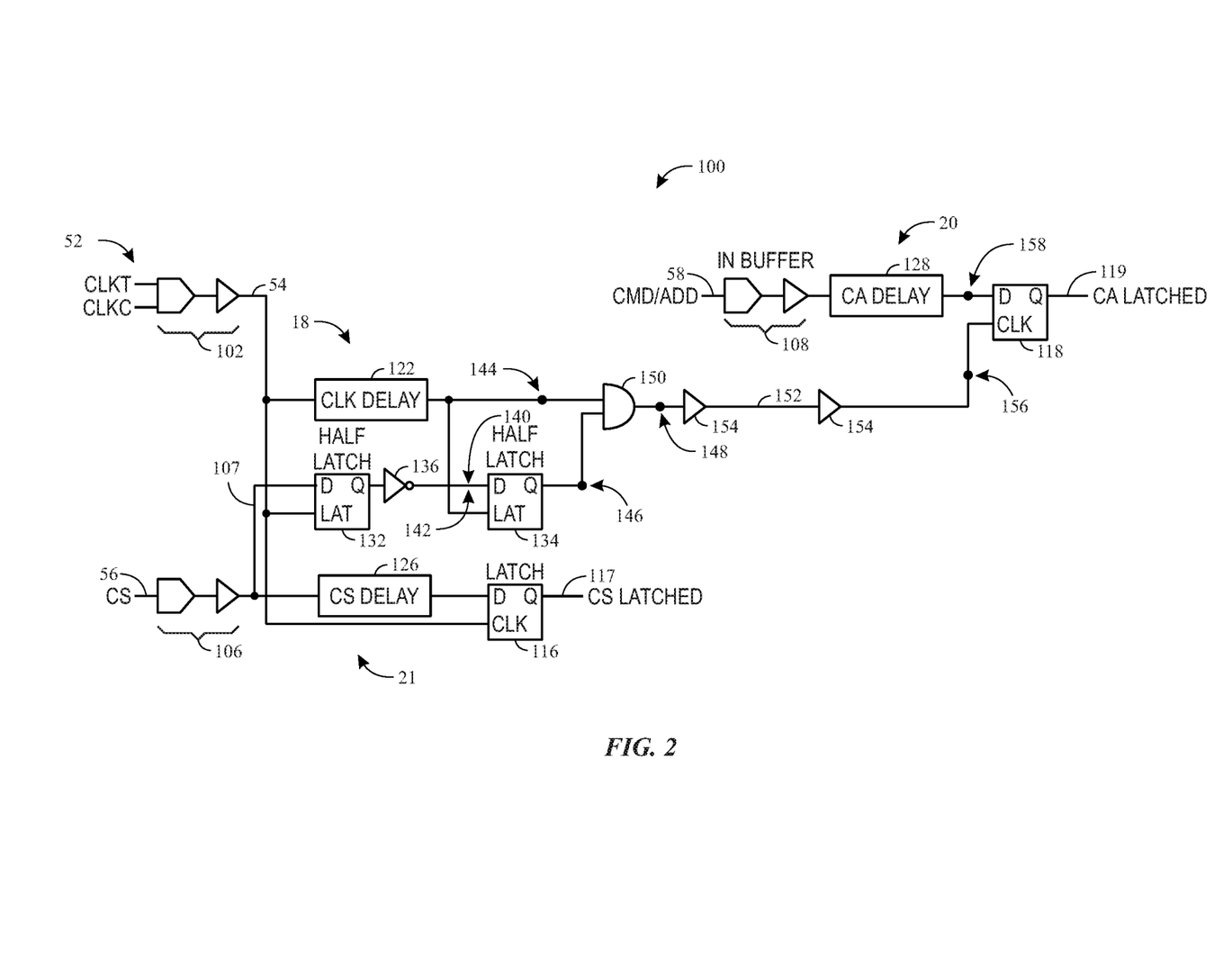
FIG. 2 illustrates a block diagram of circuitry that may be used to latch a chip select (CS) signal and/or the command/address (CA) signal based on a received clock signal and includes delay elements that may lead to faster tAA, in accordance with an embodiment.

With the foregoing in mind, the electrical circuit 100 in FIG. 2 illustrates a portion of the clock input circuit 18, the command address input circuit 20, and chip select input circuit 21. Electrical circuit 100 illustrates processing circuitry 102 that receive the Clk signal 52 as the differential pair Clk_t and Clk_c, and provides a digital clock signal CLK 54. Processing circuitry 102 may include a differential amplifier that converts the differential pair Clk_t and Clk_c into a digital signal. Processing circuitry 102 may also include a buffer that may stabilize the digital clock signal CLK 54. Electrical circuit 100 also illustrates an input buffer 106 that stabilizes the received CS signal 56, for utilization by the circuitry. Similarly, electrical circuit 100 illustrates a buffer 108 that stabilizes the CA signal 58, for utilization by the circuitry. CS signal 56 and CA signal 58 may be further stabilized by the use of CS latch 116 and CA latch 118. CS latch 116 may be used to provide a latched CS signal 117, and CA latch 118 may be used to provide a latched signal 119. As detailed above, the latches 116 and 118 may store signals that were intended to be captured during an edge of CLK 54, and thus, are stable signals that may be properly used by the SDRAM device 10.

To obtain the latched CS signal 117, CS signal 107 from buffer 106 may be available to a data input of CS latch 116. The data may be delayed by a CS delay 126. The CS delay 126 may be a fixed or a programmable delay circuit. CS latch 116 may latch the received CS signal according to CLK 54. The CS delay 126 may be adjusted such that CS latch 116 may latch CS signal 56 when appropriately latched by CLK 54, as determined during a CS training process. Further, the CS delay 126 may be adjusted to cause a device coupled with the memory to advance the CS signal 56 during the training process, as detailed below. Also, the delays 122, 126, and 128 may be adjusted dynamically or pre adjusted such that the latencies in the pipeline are matched. For example, a latency between the CS input buffer 106 and gate 150 may be matched to a latency between the processing circuitry 102 and the gate 150. Moreover, a latency between processing circuitry 102 and latch 118 may match the latency between CA buffer 108 and latch 118. Further, the latched CS signal 117 and latched CA signal 119 may be made available with a clock skew, based on the configuration of the delay elements.

CS signal 107 from buffer 106 may also be used to gate off the CLK 54 from other circuitry, such as the CA input circuitry 20. Such gating may be used to prevent the memory device 10 from processing a CA signal 58. The CS signal 107 from the CS input circuitry 106 may travel through a first half-latch circuitry 132 and a second half-latch circuitry 134 coupled via an inverting buffer 136. The first half-latch circuitry 132 may latch CS signal using a CLK signal 54. The second half-latch circuitry 134 may latch the CS signal from inverter 136 using a delayed version of CLK signal 54, provided by CLK delay 122. CLK delay 122 may be fixed or programmable circuitry, and may be adjusted such that the CLK signal received in node 142 may correspond to the CS signal received in node 140. The CS signal latched in second half-latch circuitry 134, illustrated in node 146, may gate the delay clock signal in node 144 to produce a gated clock signal 148.

Gated clock signal 148 may be used to latch the CA signal 58. The gated clock signal 148 may be transmitted to CA latch 118 by a transmission line 152 which may have buffers 154. The transmission line 152 and buffers 154 may generate a latency between the gated clock signal 148 at the gate and the gated clock signal 156 at the CA latch 118. As discussed above, CA latch 118 may latch the CA signal 58. In order to latch the data properly, a CA delay 128 circuitry may add a delay to the CA signal 58 to allow the data at CA signal at node 158 to correspond to the gated clock signal 148. Advantageously, the presence of CS delay circuitry 126 and the adjustment in CA delay circuitry 128 may lead to a reduced skew between latched CS signal 117 and latched CA signal 119, which may be significantly smaller than a clock cycle (e.g., <10% of a clock cycle). As detailed below, this skew may be reduced further to decrease the tAA by causing an anticipation of the CS signal 56 during a training mode with CS delay circuitry 126.

As discussed above, circuitry 100 may provide latched CS signal 117 and latched CA signal 119 when the CS signal 56 informs that the memory device 10 should process the CA signal 58. Latching of the CA signal may be performed by gating the clock signal 54 using the CS signal 56. As this system is operating synchronously, CLK delay 122, CS delay 126 and CA delay 128 may be adjusted to improve the performance. For example, in some systems, an increase in the delay in CS delay 126 may be accompanied by a decrease in CLK delay 122 and CA delay 128 without substantial change in the logic performance of system 100. Such change may provide an improved performance with respect to power and/or latency of the overall system, as the overall time for providing latched CA signal 119 is reduced. In some implementations, CS delay circuitry 126 may be adjusted to provide a CS latency that is similar (i.e., similar up to 10% of the value) to a gating latency of the clock signal between processing circuitry 102 and latch 118.

Figure 3A:
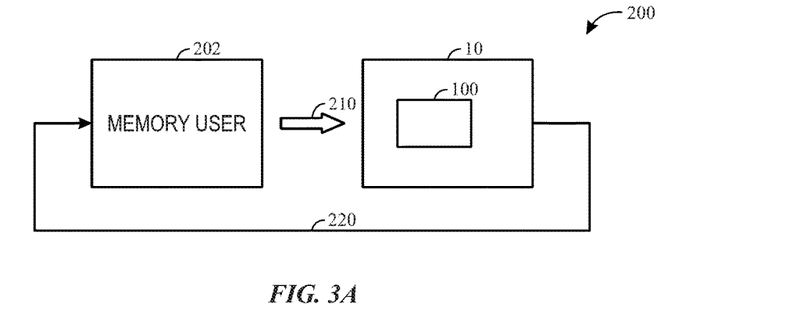
FIG. 3A illustrates a block diagram for a memory device coupled to a memory driver to perform read training, in accordance with an embodiment.
Figure 3B:
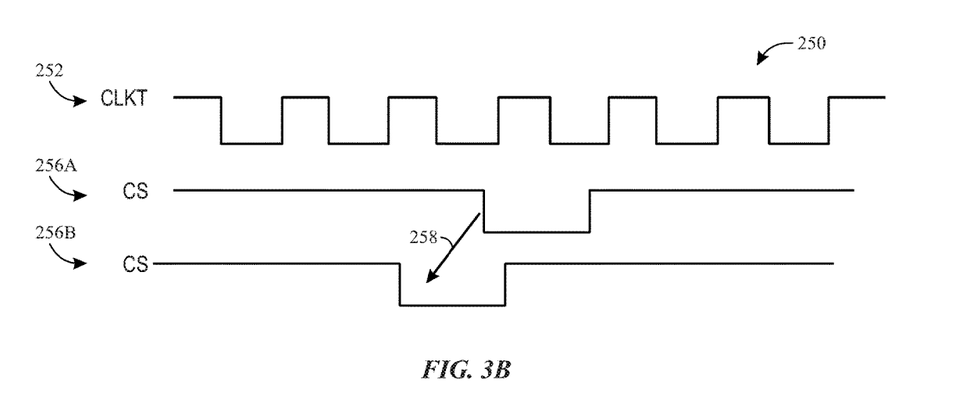
FIG. 3B illustrates a timing diagram illustrating the effect of an increased delay in a CS signal during a read training process, in accordance with an embodiment.

Moreover, in some situations, a training process that includes the memory device and a memory driver system (e.g., a user device) may be employed. The training process may be performed during initialization of operations or during refreshes. As an example, a CS training process may be performed, as illustrated in FIGS. 3A and 3B. FIG. 3A illustrates a block diagram 200 of a memory driver 202 that may be coupled to a memory device 10 having circuitry 100. Memory device 10 may receive (data 210) from memory driver 202 a differential clock signal 52 and a CS signal 56, as discussed. During the CS training process, the memory driver may adjust the timing of the CS based on a response 220 of the memory device 10 to the training CS signal. For example, the memory driver system may provide a clock signal 52 and a CS signal 56, and may monitor the response 220 (e.g., latched CS signal 117) during training. Upon noticing an excessive lag in the response 220, the memory driver may advance the CS signal 56 relative to the clock signal 52. FIG. 3B illustrates this advance behavior through chart 250. Chart 250 shows clock signal 252 and an initial CS signal 256A. After the training process, memory driver 202 may advance (arrow 258) the CS signal 256A to provide CS signal 256B. The advancement of CS signal may allow a reduction in the latencies introduced by CLK delay 122 and CA delay 128. As discussed above, such reduction may further decrease the power consumption in memory device 10 and reduce the overall latency for CA latching.

Figure 4:
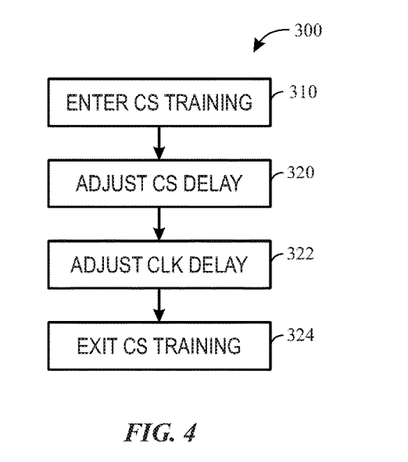
FIG. 4 illustrates a method for adjustments of delays during read training to reduce tAA, in accordance with an embodiment.

The above-discussed process may be performed dynamically if the delay circuits employed are programmable. Method 300 in FIG. 4 illustrates a technique that may be implemented by circuitry, such as circuitry 100, to readjust the delays during CS training. In a process 310, the system may enter in CS training mode. During CS training mode, the device using the memory may make requests to the memory device 10 using CS signals and differential CLK signals, and monitors the return of the request. Based on the return latency, the user device may adjust the timing of its CS signals relative to the CLK signal sent. In a process 320, delay circuitry in the CS line, such as the delay circuitry discussed above, may be adjusted to increase the latency of the return of the request. This adjustment may cause the user device to advance the CS signal relative to the CLK signal. As a result, the CS signal may reach device 10 earlier than the CA signal and, thus, delays due to gating the CLK to a CA latch may be compensated without need of excessive delays in the CA line. In a process 322, CLK delay may also be adjusted accordingly, and the circuitry may leave the CS training mode (process 324). Note that adjustments of the CS delay (process 320) and/or clock delay (process 322) may take place prior to entering the CS training (process 310). It should also be noted the CA delay may also be programmable and, thus, a process for increasing and/or decreasing its delay may take place in method 300. It will be appreciated that in circuits employing non-adjustable delay circuitries, the delay may be adjusted during the configuration of the communication between the processor and the memory device in view of the CS training process.

While the embodiments described herein may be susceptible to various modifications and alternative forms, specific embodiments have been shown by way of example in the drawings and have been described in detail herein. However, it should be understood that the disclosure is not intended to be limited to the particular forms disclosed. Rather, the disclosure is to cover all modifications, equivalents, and alternatives falling within the spirit and scope of the techniques and system described in the disclosure as defined by the following appended claims.

What is claimed is:

1. A memory device comprising:
a command interface comprising:
clock input circuitry configured to provide a clock signal;
gating circuitry configured to generate a gated clock signal based on the clock signal and on a gating chip select (CS) signal;
chip select (CS) input circuitry configured to receive an input CS signal and to provide the gating CS signal and a latched CS signal, wherein the CS input circuitry comprises a CS delay element disposed between a CS input buffer and a CS latch configured to provide the latched CS signal; and
command/address (CA) input circuitry comprising a CA latch and a CA delay element disposed between a CA buffer and the CA latch, wherein the CA input circuitry is configured to receive the gated clock signal and an input CA signal and provide a latched CA signal, and wherein the CA delay element and the CS delay element are configured to minimize a skew between the latched CA signal and the latched CS signal.

2. The memory device of claim 1, wherein the gating circuitry comprises an AND gate configured to receive the clock signal and the CS signal and provide the gated clock signal.

3. The memory device of claim 1, wherein the gating circuitry comprises:
a first half-latch configured to provide a latency to the input CS signal; and
a second half-latch configured to provide the gating CS signal.

4. The memory device of claim 3, wherein the first and the second half-latches comprise a first latency for the gating CS signal, and wherein the clock input circuitry comprises a clock delay element configured to match the first latency.

5. The memory device of claim 1, wherein the command interface comprises a transmission line comprising a second latency and configured to carry the gated clock signal from the gating circuitry to the CA input circuitry, the transmission line comprising at least one buffer, and wherein the CA delay compensates the second latency.

6. The memory device of claim 1, wherein the memory device comprises a training mode for the CS signal.

7. The memory device of claim 1, wherein the memory device comprises an access time (tAA) in a range between 14 and 18 ps.

8. A semiconductor device comprising:
a command interface configured to receive a clock signal, a chip select (CS) signal, and a command/address (CA) signal, wherein the command interface comprises:
a clock delay configured to receive the clock signal and to generate a delayed clock signal;
CS circuitry configured to provide a gating CS signal and a delayed CS signal, wherein the CS circuitry comprises CS delay circuitry configured to delay the received CS signal and a CS latch to provide a latched CS signal; and
CA circuitry comprising delay circuitry configured to delay the CA signal and a CA latch configured to receive the delayed CA signal and the gated CS signal to provide a latched CA signal;
memory circuitry configured to store data; and
an input/output (I/O) interface configured to provide the stored data based on the latched CS signal and the latched CA signal; and
wherein the semiconductor device comprises an access time (tAA) that comprises a time interval between receiving the CA signal and providing the stored data, and wherein a delay of the CS delay circuitry and a delay of the CA delay circuitry are configured to reduce the tAA by minimizing a skew between the latched CS signal and the latched CA signal.

9. The semiconductor device of claim 8, wherein the command interface is configured to operate in a CS training mode.

10. The semiconductor device of claim 8, wherein the gating circuitry comprises a first latency, and wherein the delay of the CS delay circuitry is determined based on the first latency.

11. The semiconductor device of claim 10, wherein the delay of the CS delay circuitry is equal to the first latency.

12. A method to operate a memory device, the method comprising:
receiving, in CS circuitry, a chip select (CS) signal;
providing, using the CS circuitry, a gating CS signal
receiving, in command/address (CA) circuitry, a CA signal;
delaying, in the CA circuitry, the CA signal;
latching, in the CA circuitry, the delayed command/address (CA) signal based on the gating CS signal;
delaying, in the CS circuitry, the CS signal; and
latching, in the CS circuitry, the delayed received CS signal, wherein delaying the CA signal and delaying the CS signal are configured to minimize a clock skew between the latched CA signal and the latched CS signal.

13. The method of claim 12, wherein latching the CA signal comprises:
receiving a clock signal;
gating the clock signal using the gating CS signal; and providing the gated clock signal to a CA latch that latches the CA signal.

14. The method of claim 12, wherein delaying the CS signal is configured to advance the CS signal.

15. The method of claim 14, wherein the clock skew between the latched CA signal and the latched CS signal is smaller than a clock cycle.

* * * * *